(12) United States Patent
Jonsson

(10) Patent No.: US 10,126,371 B2
(45) Date of Patent: Nov. 13, 2018

(54) DETERMINATION OF BATTERY TYPE

(71) Applicant: ASSA ABLOY AB, Stockholm (SE)

(72) Inventor: Tomas Jonsson, Roenninge (SE)

(73) Assignee: ASSA ABLOY AB (SE)

( * ) Notice: Subject to any disclaimer, the term of this patent is extended or adjusted under 35 U.S.C. 154(b) by 10 days.

(21) Appl. No.: 15/037,800

(22) PCT Filed: Nov. 21, 2014

(86) PCT No.: PCT/EP2014/075252
§ 371 (c)(1),
(2) Date: May 19, 2016

(87) PCT Pub. No.: WO2015/075173
PCT Pub. Date: May 28, 2015

(65) Prior Publication Data
US 2016/0291092 A1    Oct. 6, 2016

(30) Foreign Application Priority Data

Nov. 22, 2013   (EP) .................................... 13193975

(51) Int. Cl.
G01R 31/36    (2006.01)
H02J 7/00    (2006.01)
H02J 7/35    (2006.01)

(52) U.S. Cl.
CPC ....... *G01R 31/3665* (2013.01); *G01R 31/362* (2013.01); *G01R 31/3648* (2013.01); *H02J 7/0008* (2013.01); *H02J 7/35* (2013.01)

(58) Field of Classification Search
CPC .. G01R 31/36; G01R 31/3606; G01R 31/362; G01R 31/3648; G01R 31/3665;
(Continued)

(56) References Cited

U.S. PATENT DOCUMENTS 5,164,652 A * 11/1992 Johnson ............. H01M 6/5066
                                                  320/106
6,215,275 B1 * 4/2001 Bean .................. G01R 31/3665
                                                  320/106
(Continued)

FOREIGN PATENT DOCUMENTS

CN    103283082    9/2013
EP    0611106    8/1994

OTHER PUBLICATIONS

Official Action for European Patent Application No. 13193975.3, dated Jun. 16, 2017, 4 pages.
(Continued)

*Primary Examiner* — Tung X Nguyen
*Assistant Examiner* — David Frederiksen
(74) *Attorney, Agent, or Firm* — Sheridan Ross P.C.

(57) ABSTRACT

It is presented a method for determining a battery type of a battery set powering a host device, the battery set comprising at least one exchangeable battery. The method is performed in a battery type determiner and comprises the steps of: measuring a voltage of the battery set, yielding a voltage measurement; determining charge depletion of the battery set; storing the voltage measurement and the charge depletion; repeating the steps of measuring, determining charge depletion and storing until an exit condition is true; and determining the battery type based on the stored voltage measurements and the stored charge depletion. A corresponding battery type determiner, host device, computer program and computer program product are also presented.

20 Claims, 3 Drawing Sheets

(58) Field of Classification Search
CPC ...... H02J 7/0003; H02J 7/0006; H02J 7/0008; H02J 7/35
See application file for complete search history.

(56) References Cited

U.S. PATENT DOCUMENTS

| | | | |
|---|---|---|---|
| 6,404,164 B1 | 6/2002 | Bean et al. | |
| 2004/0095096 A1* | 5/2004 | Melton | H02J 7/0008 320/132 |
| 2007/0040449 A1* | 2/2007 | Spurlin | A61M 5/14244 307/64 |
| 2009/0146664 A1* | 6/2009 | Zhang | G01R 31/3648 324/433 |
| 2009/0189547 A1* | 7/2009 | Spartano | H01M 6/50 315/307 |
| 2011/0309839 A1 | 12/2011 | Tan | |
| 2012/0169271 A1 | 7/2012 | Dvorkin et al. | |
| 2012/0235823 A1* | 9/2012 | Trock | G01R 31/3679 340/636.1 |
| 2013/0151181 A1 | 6/2013 | Sebastiani et al. | |
| 2013/0328567 A1* | 12/2013 | Watanabe | G01R 31/3606 324/433 |

OTHER PUBLICATIONS

International Search Report and Written Opinion prepared by the European Patent Office dated Feb. 24, 2016, for International Application No. PCT/EP2014/075252.
Official Action with English Translation for China Patent Application No. 201480063370.8, dated Mar. 29, 2018, 23 pages.
Official Action for European Patent Application No. 13193975.3, dated May 23, 2018, 3 pages.
Official Action for European Patent Application No. 13193975.3, dated Oct. 27, 2017, 3 pages.

* cited by examiner

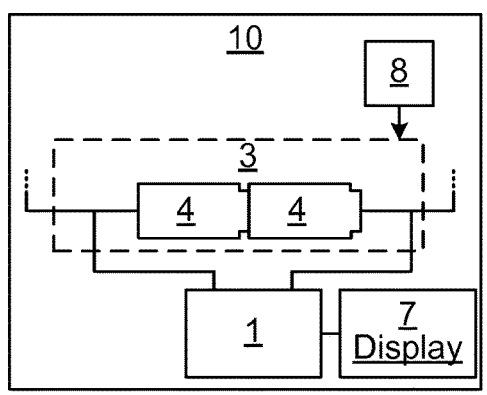
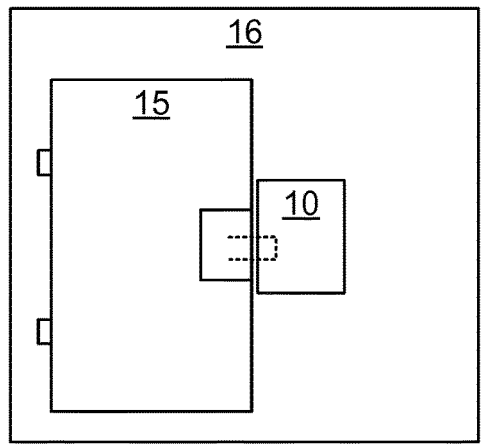
Fig. 1
Fig. 2
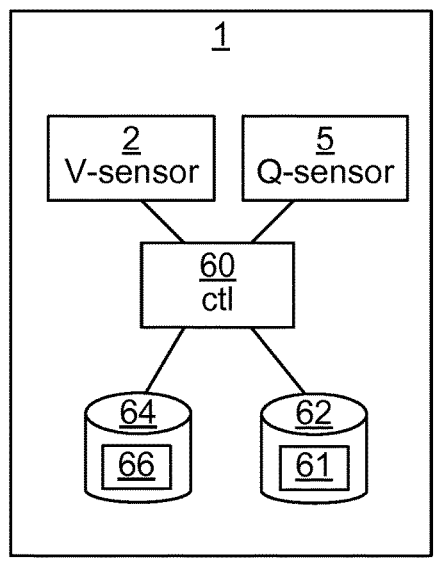
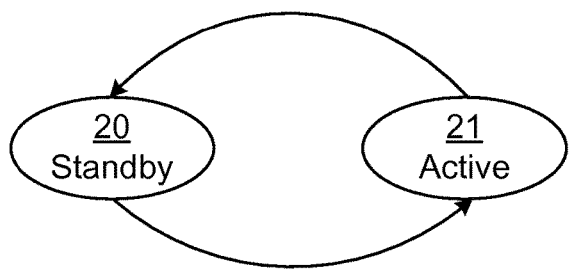
Fig. 3
Fig. 4

DETERMINATION OF BATTERY TYPE

CROSS REFERENCE TO RELATED APPLICATIONS

This application is a national stage application under 35 U.S.C. 371 and claims the benefit of PCT Application No. PCT/EP2014/075252 having an international filing date of Nov. 21, 2014, which designated the United States, which PCT application claimed the benefit of European Patent Application No. 13193975.3 filed Nov. 22, 2013, the disclosures of each of which are incorporated herein by reference.

TECHNICAL FIELD

The invention relates to a method, battery type determiner, host device, computer program and computer program product for determining battery type.

BACKGROUND

Electronic devices can be powered in many different ways. One common way to power electronic devices is to use battery sets of one or more batteries. Often times, the batteries are replaceable batteries of standard battery cell sizes (for example AA or AAA). There are many different types of batteries with different advantages such as cost, battery life, rechargeable/disposable, etc. For example, there are alkaline batteries, 1.5V lithium batteries, 3V lithium batteries as well as rechargeable lithium batteries.

This creates an issue in that different battery technologies require different type of battery status functions to accurately determine remaining charge level in the battery set.

US2011/0309839 shows calibration electronic devices to facilitate accurate identification of the types of batteries used with the electronic devices. A parasitic resistance is calculated of the electronic device, to enable identification of the battery as rechargeable or non-rechargeable. However, this method requires an accurately calibrated voltage source. It is desired not to place such a requirement on each device where the battery type should be determined, which implies complexity and cost during the manufacture of the electronic device comprising the batteries.

U.S. Pat. No. 6,404,164 B1 discloses a method of identifying battery chemistry of a battery in an electronic device by monitoring voltage behavior of the battery in response to a stimulus. However, both the application of stimulus and the monitoring of response require accurate timing and fast processing.

SUMMARY

It is an object to provide a way to determine battery types which is more robust than what is known in the prior art and does not depend on accurate calibrations.

According to a first aspect it is presented a method for determining a battery type of a battery set powering a host device, the battery set comprising at least one exchangeable battery. The method is performed in a battery type determiner and comprises the steps of: measuring a voltage of the battery set, yielding a voltage measurement; determining charge depletion of the battery set; storing the voltage measurement and the charge depletion; repeating the steps of measuring, determining charge depletion and storing until an exit condition is true; and determining the battery type based on the stored voltage measurements and the stored charge depletion. The voltage measurements are relatively easy to obtain and the charge depletion can be determined with relatively small effort. These parameters are sufficient to determine battery type. This is a robust way to determine battery type which can be applied in many different environments. Moreover, such measurements do not require multiple fast samples of voltages, e.g. to determine response to a stimulus, as required in the prior art.

The step of determining may comprise the substeps of: calculating a rate of change of the voltage in relation to the charge depletion based on the stored voltage measurements and the stored charge depletion; determining the battery type to be an alkaline battery when the rate of change is greater than a threshold rate; and determining the battery type to be a lithium battery when the rate of change is less than a threshold rate. The rate of change is one good characteristic which can be used to distinguish between some key battery types, such as between lithium and alkaline batteries.

The step of determining may comprise the sub-steps of: comparing the stored voltage measurements in relation to charge depletion with curves of voltage in relation to charge depletion for a plurality of battery types; selecting the curve which best matches the stored voltage measurements in relation to charge depletion; and determining the battery type of the battery set to be the battery type of the selected curve. By comparing with such curves, a reliable and accurate way to determine battery type is achieved.

In the sub-step of comparing, the curves may comprise a curve for a battery set comprising mixed battery types. It can be of great benefit to detect mixed battery types to alert the user of such a situation. Mixed battery types are a potential safety hazard, e.g. if one battery runs out before the other, and gets energized by the still functioning battery.

The step of determining may comprise: when the battery type is determined to be a lithium battery, determining whether the battery set is rechargeable or not based on an initial voltage measurement. This is one distinguishable difference between lithium batteries which are rechargeable or not.

The step of determining charge depletion may comprise measuring change of charge depletion when the host device is an active state, and estimating change of charge depletion when the host device is in a standby state based on a constant charge depletion per time unit.

The step of determining charge depletion may comprise measuring an increase of charge when the battery set is charged.

The exit condition may be true when the charge depletion has reached a threshold charge depletion.

The exit condition may be true when the voltage of the battery set has reached a voltage level determined to end the measurements.

The exit condition may be true when a specific amount of time has passed.

The method may further comprise the step of: determining a status of the battery based on the determined battery type.

The first iteration of determining a status of the battery may comprise determining whether the battery was new when the method started.

The method may further comprise the step of: warning that the battery set needs to be replaced when the battery status indicates that the battery set is near the end of operation.

According to a second aspect, it is presented a battery type determiner for determining a battery type of a battery set arranged to power a host device. The battery set comprises at least one exchangeable battery. The battery type determiner comprises: a voltage sensor arranged to measure a voltage of the battery set, yielding a voltage measurement; a charge depletion sensor arranged to determine a charge depletion of the battery set; a memory arranged to store the voltage measurement and the charge depletion; and a controller arranged to repeat measuring the voltage and storing the voltage measurement until an exit condition is true, to thereafter determine the battery type based on the stored voltage measurements and the stored charge depletion.

According to a third aspect, it is presented a host device comprising the battery type determiner according to the second aspect, wherein the battery type determiner is arranged to determine the battery type of a battery set powering the host device.

The host device may be a lock device for restricting physical access to a confined space.

According to a fourth aspect, it is presented a computer program for determining a battery type of a battery set powering a host device, the battery set comprising at least one exchangeable battery. The computer program comprises computer program code which, when run on a battery type determiner causes the battery type determiner to: measure a voltage of the battery set, yielding a voltage measurement; determine charge depletion of the battery set; store the voltage measurement and the charge depletion; repeat the instructions to of measure, determine charge depletion and store until an exit condition is true; and determine the battery type based on the stored voltage measurements and the stored charge depletion.

According to a fifth aspect, it is presented a computer program product comprising a computer program according to the third aspect and a computer readable means on which the computer program is stored.

Any feature of the first, second, third, fourth and fifth aspect may, where appropriate, be applied to any other of these aspects.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which:

FIG. 1 is a schematic diagram of a host device comprising a battery set according to one embodiment;

FIG. 2 is a schematic diagram of one embodiment of the host device of FIG. 1 where the host device is a lock device;

FIG. 3 is a schematic diagram of the battery type determiner of FIG. 1 according to one embodiment;

FIG. 4 is a state diagram illustrating states used by the host device of FIG. 1;

DETAILED DESCRIPTION

Figure 5A:
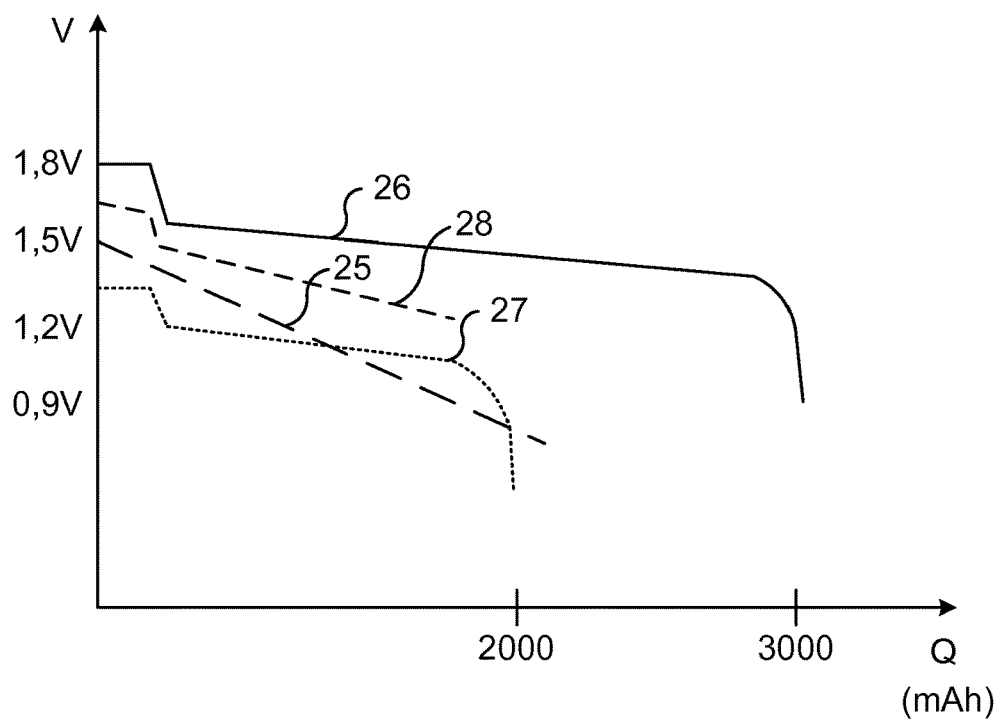
FIGS. 5A-B are schematic graphs illustrating battery curves for batteries of different types of host device of FIG. 1 according to various embodiments.

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

FIG. 1 is a schematic diagram of a host device 10 comprising a battery set 3 according to one embodiment. The host device 10 can be any device which uses the battery set 3 for power, such as, but not limited to, an electrically powered lock device, a wireless door sensor, window sensor, etc.

The battery set 3 comprises one or more batteries 4 for desired voltage and/or capacity. The batteries 4 are of any suitable replaceable type and may be primary batteries (disposable) or secondary batteries (rechargeable). The batteries 4 can be of different types, e.g. alkaline, lithium, etc. Optionally, the host device 10 comprises one or more other power sources 8, such as energy harvesting sources. The one or more other power sources 8 can be used for powering the host device 10 and/or for charging the batteries 4, provided that the batteries 4 are rechargeable. The one or more other power source 8 can e.g. be a solar power source, a wind power source or a user driven mechanical power source.

A battery type determiner 1 is connected to the battery set 3 to determine the type of battery, e.g. alkaline, lithium, etc., which is used for the one or more batteries 4. Moreover, the battery type determiner can be used to determine also what type of Lithium battery is used, such as 1.5V lithium ($Li/FeS_2$), 3V lithium ($Li/MnO_2$), rechargeable lithium (Li/NiMH or Li-Ion) or zinc-air.

A display 7 or other user interface device allows the host device to present the status of the battery set to a user of the host device.

FIG. 2 is a schematic diagram of one embodiment of the host device of FIG. 1 where the host device 10 is a lock device. In this example, there is a door 15 which mechanically interacts with the lock device 10, e.g. using a bolt. The lock device 10 comprises electronics powered by the battery set which is used to selectively mechanically control access to a closed space 16, e.g. using RFID (Radio Frequency Identification) and/or NFC (Near Field Communication) or any other suitable technology.

FIG. 3 is a schematic diagram of the battery type determiner 1 of FIG. 1 according to one embodiment. A controller 60 is provided using any combination of one or more of a suitable central processing unit (CPU), multiprocessor, microcontroller, digital signal processor (DSP), application specific integrated circuit etc., capable of performing one or more of the methods described herein. For example, if the controller 60 is a processor, it can execute software instructions 66 stored in a memory 64, which can thus be considered to be a computer program product.

The memory 64 can be any combination of read and write memory (RAM) and read only memory (ROM). The memory 64 also comprises persistent storage, which, for example, can be any single one or combination of magnetic memory, optical memory, or solid state memory.

A data memory 62 can also be provided, being any combination of read and write memory (RAM) and read only memory (ROM). The data memory 62 may also comprise persistent storage, which, for example, can be any single one or combination of magnetic memory, optical memory or solid state memory. Data 61 stored in the data memory 62 can e.g. comprise voltage measurements, reference curves, etc.

A voltage sensor 2 is connected across the battery set (3 of FIG. 1) to measure the voltage across the battery set. This measurement can be performed repeatedly under the control of the controller 60, which can store voltage measurements in the data memory 62. The voltage measurement typically involves connecting a known load to the battery set.

A charge depletion sensor 5 is also connected to the battery set 3. The charge depletion sensor is used to determine charge depletion since the batteries were first installed, corresponding to the horizontal axis of FIGS. 5A-B. The charge depletion can e.g. be determined by measuring a current from the battery set and integrating the current over time, since a current multiplied by time yields the charge. In other words, the charge depletion sensor 5 can comprise a current sensor which is used together with time by the controller 60 to determine the charge depletion. The charge depletion determination can e.g. be performed continuously when the host device is active, under the control of the controller 60, which can store voltage measurements with association to charge depletion in the data memory 62. Each such voltage/charge depletion pair corresponds to a data point which could e.g. be plotted in FIGS. 5A-B. When the host device is in standby mode, the charge depletion can be estimated using a configured standby current, indicating a charge depletion per time unit. The standby current is made up of the host device standby current and the self discharge current of the battery set. It is to be noted that the charge depletion sensor could be replaced by an energy depletion sensor to reach the same effect. It is to be noted however, that the curves of FIGS. 5A-B would have slightly different appearances if energy is used instead of charge.

One or more of the components shown here being part of the battery type determiner 1 can be shared with the host device, and thus do not need to, but could be, dedicated to the battery type determiner 1.

Other components of the battery type determiner 1 are omitted in order not to obscure the concepts presented herein.

FIG. 4 is a state diagram illustrating states used by the host device 10 of FIG. 1. There are here two states—an active state 21 and a standby state 20. In the active state 21, the host device is fully active and operable. In the standby state 20, the host device is in a battery saving low power state.

A transition from the active state 21 to the standby state 20 can e.g. occur due to an inactivity timer expiring. A transition from the standby state 20 to the active state 21 can occur due to a wake-up event. The wake-up event can for instance be the expiry of a wake-up timer or a user action, e.g. by pushing a button of the host device or by presenting an RFID card/NFC device in the proximity of the host device.

When the host device returns to the active state 21, this is detected by the battery type determiner 1, e.g. by the battery type determiner reflecting the states of the host device. The charge depletion which has happened while in the standby state can be estimated based on a constant charge depletion per time unit multiplied by the amount of time that the host device was in the standby state 20.

Figure 5B:
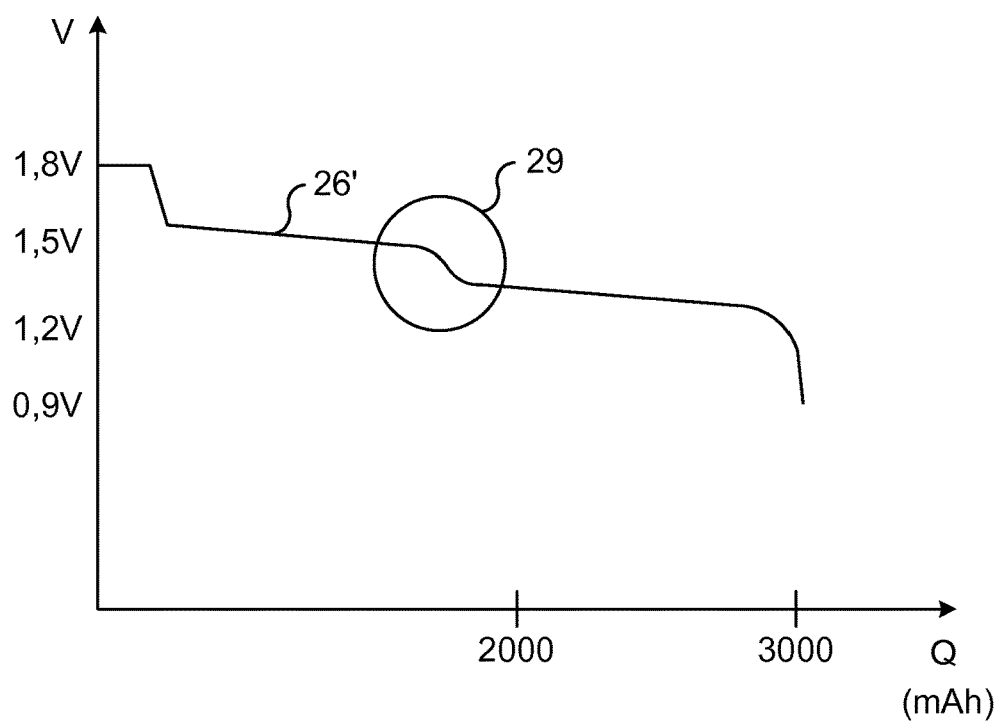

FIGS. 5A-B are schematic graphs illustrating battery curves for batteries of different types of host device of FIG. 1 according to various embodiments. The vertical axis represents voltage (V) and the horizontal axis represents charge depletion (Q) in mAh (milliampere hours). The diagram shows a number of reference curves which schematically illustrate voltage levels for various battery types plotted against charge depletion of the battery in question. The curves in the diagram relate to values per battery, whereby a voltage measured across a battery set of two batteries would need to be divided by two to be compared with the curves shown in FIGS. 5A-B.

Referring first to FIG. 5A, a lithium primary battery curve 26 is shown as a solid line and represents the voltage over charge depletion for a primary (disposable) battery being a lithium battery, e.g. $Li/FeS_2$. It can be seen that there is a sharp drop in voltage relatively quickly. After the sharp drop, the voltage stays relatively flat until it reaches the end of the battery at around 3,000 mAh. If such a sharp drop is observed in a battery, it indicates both that the battery is a lithium battery, and that the battery is new. This allows a more accurate estimation of remaining battery capacity.

An alkaline battery curve 25 is shown as a long dashed line and represents the voltage over charge depletion for a primary battery being an alkaline battery. For this type of battery, the voltage drops at a higher rate than the lithium battery and there is also not an initial sharp drop.

A lithium secondary battery curve 27 is shown as a dotted line and represents the voltage over charge depletion for a secondary (rechargeable) battery being a lithium battery, e.g. Li/NiMH. As for the lithium primary battery curve 26, it can be seen that there is a sharp drop in voltage relatively quickly. After the sharp drop, the voltage stays relatively flat until it reaches the end of the battery at around 2,000 mAh.

A mixed battery curve 28 is shown as a short dashed line and represents the voltage over charge depletion for a battery set with mixed batteries comprising an alkaline battery and a lithium primary battery. The mixed battery curve is between the alkaline battery curve 25 and the lithium primary battery curve 26.

Referring now to FIG. 5B, a lithium primary there is an alternative lithium primary battery curve 26'. In this curve, there is a detectable kink 29 which is not present e.g. for alkaline batteries. In one embodiment, the curve 26' with the kink 29 is the reference curve for lithium primary batteries. In this way, the distinction between lithium and alkaline batteries can be made even more reliable. Moreover, since the kink is often consistent between battery types in relation to remaining energy in the battery, a presence of the kink 29 can be used to better estimate remaining battery capacity.

As presented in more detail below, by observing an actual curve of voltage over charge depletion and comparing with characteristic curves of different battery types (such as those shown in FIG. 5A) the type of battery or batteries used in the battery set can be identified.

Figure 6:
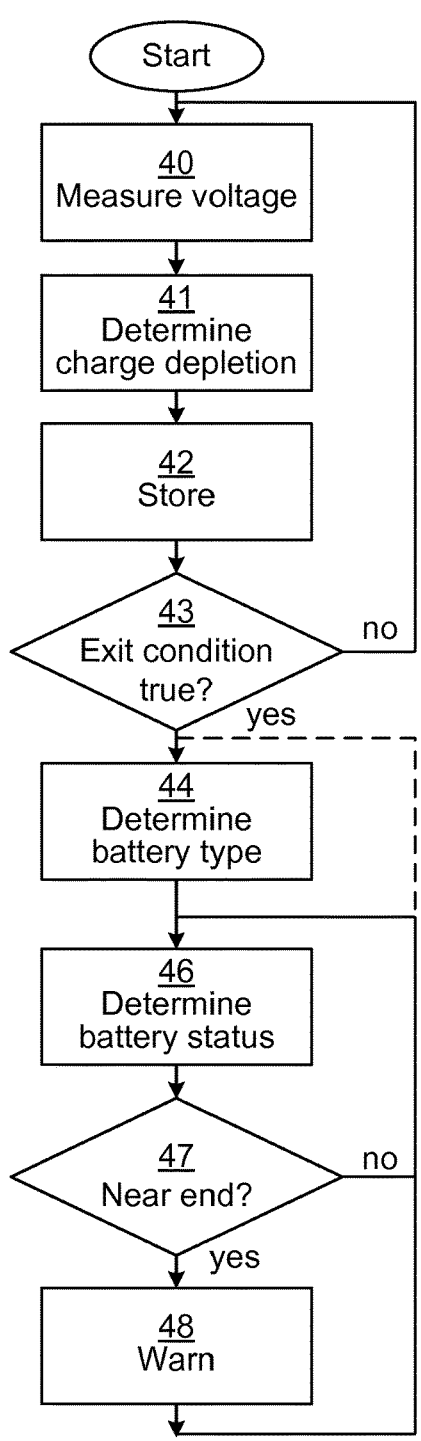
FIG. 6 is a flow chart illustrating a method according to one embodiment performed in the battery type determiner of FIG. 3.

FIG. 6 is a flow chart illustrating a method according to one embodiment performed in the battery type determiner of FIG. 3. The method is performed to determine a battery type of a battery set powering a host device (see FIG. 1).

In a measure voltage step 40, a voltage of the battery set is measured, yielding a voltage measurement. This can be performed using the voltage sensor (2 of FIG. 3).

In a determine charge depletion step 41, a charge depletion of the battery set is determined. This can be performed using the Q meter (3 of FIG. 3).

Optionally, this comprises measuring change of charge depletion when the host device is the active state, and when the host device is in the standby state, estimating the change of charge depletion based on a constant charge depletion per time unit.

Furthermore, this may comprise measuring an increase of charge when the battery set is charged, e.g. when energy harvesting is deployed.

In a store step 42 the voltage measurement and the charge depletion is stored in a memory (62 of FIG. 3). The voltage measurement is stored with an association to the charge depletion, corresponding to a point in the diagram of FIG. 5.

In a conditional exit condition true step 43, it is determined whether more measurements should be performed to be able to determine the battery type. If this is the case, the method returns to the measure voltage step 40. Otherwise, the method continues to a determine battery type step 44.

In one embodiment, the exit condition is true when an aggregated charge depletion has reached a threshold charge depletion. Additionally or alternatively, the exit condition may be true when a specific amount of time has passed.

In the determine battery type step 44, the battery type is determined based on the stored voltage measurements. In one embodiment, when the battery type is determined to be a lithium battery, it is determined whether the battery set is rechargeable (i.e. a primary or secondary battery) based on the initial voltage measurement.

In a determine battery status step 46, a status of the battery is determined based on the determined battery type. The first iteration of determining a status of the battery may comprise determining whether the battery was new when the method started. For example, this can be checked for a lithium battery by checking if there was an initial drop in voltage. For an alkaline battery, this can be determined by the initial voltage. If the battery was not new, it may be difficult to estimate remaining charge. This uncertainty can be indicated to the host device and optionally to the user of the host device.

The status of the battery can e.g. be determined by measuring the voltage and, e.g. based on the battery type and characteristic curves (see FIG. 5), determine the charge depletion and/or remaining charge.

The status of the battery can e.g. be provided to the host device (e.g. as a percentage) for displaying a fuel gauge, e.g. either as a small icon with a relative charge level and/or as percentage value.

In a conditional near end step 47, it is determined whether the battery status indicates that the battery set is near the end of operation. If the end of the battery set is near, the method continues to a warn step 48. Otherwise, the method returns to the determine battery status step 46.

In a warn step 48, it is warned that the battery set needs to be replaced. This can be performed by the battery type determiner by itself or with assistance from the host device. For example, a signal can be sent from the battery type determiner to the host device to warn the user. The host device can then warn the user using audio signals and/or visual signals, such as an LED (Light Emitting Diode) or by displaying a suitable symbol using a battery indicator on a display of the host device. In one embodiment, the warning signal can be sent from the battery type determiner or host device to a remote device, such as an operation and maintenance system. This can e.g. be sent using a wireless network such as a personal area network (e.g. based on IEEE 802.15.4), Bluetooth, or a mobile communication network (e.g. Long Term Evolution, Wideband Code Division Multiple Access, or Global System for Mobile Communications). The remote device can be connected to several such host devices/battery type determiners to inform an operator of the remote device when the waning signal is received. In this way a service technician can be dispatched to replace the batteries as necessary.

Optionally, when the battery is very close to being discharge, the host device is set in a special state where only crucial operations are allowed.

Figure 7:
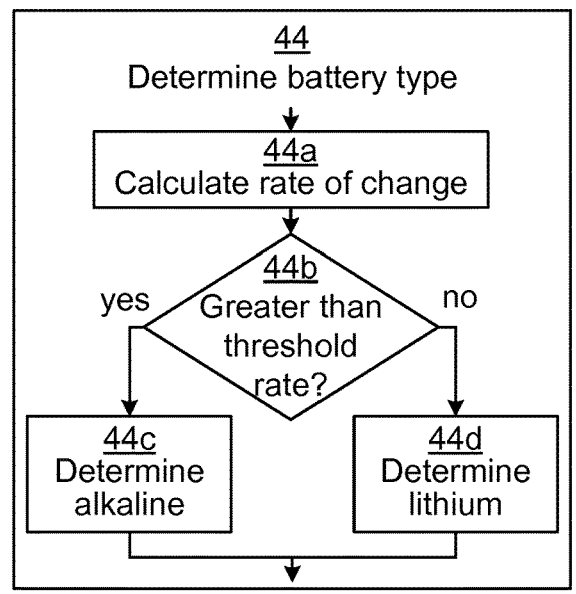
FIG. 7 is a flow chart illustrating the determine battery type step of FIG. 6 according to one embodiment.

FIG. 7 is a flow chart illustrating the determine battery type step 44 of FIG. 6 according to one embodiment.

In a calculate rate of change step 44a, a rate of change of the voltage in relation to the charge depletion is calculated based on the stored voltage measurements and the stored charge depletion.

In a conditional greater than threshold rate step 44b, it is determined if the rate of change is greater than a threshold rate. If this is true, then the method continues to the determine alkaline step 44c. Otherwise, the method continues to a determine lithium step 44d. Looking at FIG. 5, it can be seen that, apart from the initial drop for lithium batteries, the rate of change (i.e. drop rate) for alkaline batteries is significantly greater than for lithium batteries. This is exploited here to thereby determine the battery type. Optionally, the initial part (in terms of charge depletion) is not considered in this step, in order to disregard the initial drop in voltage for lithium batteries.

In the determine alkaline step 44c, the battery type is determined to be an alkaline battery.

In the determine lithium step 44d, the battery type is determined to be a lithium battery.

Figure 8:
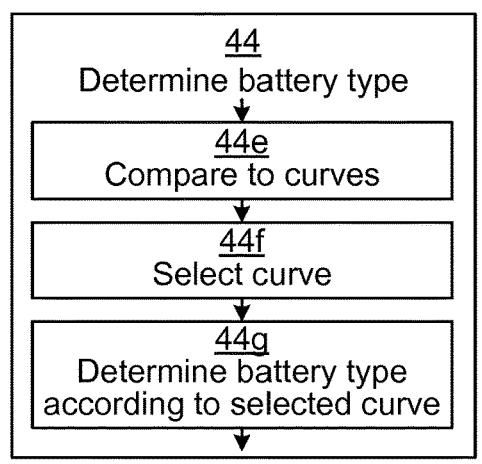
FIG. 8 is a flow chart illustrating the determine battery type step of FIG. 6 according to one embodiment.

FIG. 8 is a flow chart illustrating the determine battery type step 44 of FIG. 6 according to one embodiment. This embodiment could optionally be combined with the embodiment shown in FIG. 7.

In a compare to curves step 44e, the stored voltage measurements in relation to charge depletion are compared with curves of voltage in relation to charge depletion for a plurality of battery types, such as those shown in FIG. 5. Optionally, the curves comprise a curve for a battery set comprising mixed battery types (28 of FIG. 5). It can be of great benefit to detect mixed battery types to alert the user of such a situation. Mixed battery types are a potential safety hazard, e.g. if one battery runs out before the other, and gets energized by the still functioning battery.

In a select curve step 44f, the curve which best matches the stored voltage measurements in relation to charge depletion is selected. This can e.g. be evaluated using a least mean square calculation of the measurements in relation to the different curves.

In a determine battery type according to selected curve step 44g, the battery type of the battery set is determined to be the battery type of the selected curve.

Figure 9:
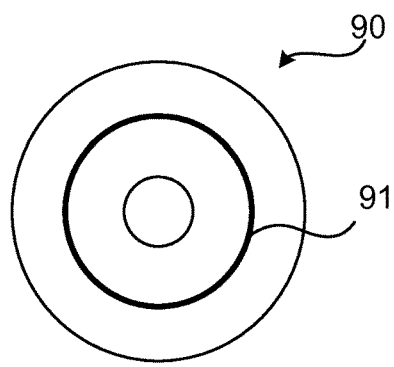
FIG. 9 is a schematic diagram showing one example of a computer program product comprising computer readable means.

FIG. 9 is a schematic diagram showing one example of a computer program product 90 comprising computer readable means. On this computer readable means a computer program 91 can be stored, which computer program can cause a processor to execute a method according to embodiments described herein. In this example, the computer program product is an optical disc, such as a CD (compact disc) or a DVD (digital versatile disc) or a Blu-Ray disc. As explained above, the computer program product could also be embodied in a memory of a device, such as the computer program product 66 of FIG. 3. While the computer program 91 is here schematically shown as a track on the depicted optical disk, the computer program can be stored in any way which is suitable for the computer program product.

Here now follows a set of embodiments enumerated with roman numerals.

i. A method for determining a battery type of a battery set (3) powering a host device (10), the battery set comprising at least one exchangeable battery (4), the method being performed in a battery type determiner (1) and comprising the steps of:
  measuring (40) a voltage of the battery set, yielding a voltage measurement;
  storing (42) the voltage measurement;
  repeating the steps of measuring (40) and storing (42) until an exit condition is true; and
  determining (44) the battery type based on the stored voltage measurements.

ii. The method according to embodiment i, wherein the step of determining (44) comprises the substeps of:
  calculating (44*a*) a rate of change of the voltage based on the stored voltage measurements;
  determining (44*c*) the battery type to be an alkaline battery when the rate of change of the voltage is greater than a threshold rate; and
  determining (44*d*) the battery type to be a lithium battery when the rate of change of the voltage is less than a threshold rate.

iii. The method according to embodiment ii, wherein the step of determining (44) comprises the sub-steps of:
  comparing (44*e*) the stored voltage measurements with voltage curves for a plurality of battery types;
  selecting (44*f*) the voltage curve which best matches the stored voltage measurements; and
  determining (44*g*) the battery type of the battery set to be the battery type of the selected voltage curve.

iv. The method according to embodiment iii, wherein in the sub-step of comparing (44*e*), the voltage curves comprise a curve for a battery set comprising mixed battery types.

v. The method according to any one of the preceding embodiments, wherein the step of determining (44) comprises: when the battery type is determined to be a lithium battery, determining whether the battery set is rechargeable or not based on the initial voltage measurement.

vi. The method according to any one of the preceding embodiments, further comprising the step of:
  determining (41) charge depletion of the battery set (3); and wherein the step of determining (41) charge depletion is also repeated until the exit condition is true.

vii. The method according to embodiment vi, wherein the step of determining charge depletion comprises measuring charge depletion when the host device is an active state (21), and estimating charge depletion when the host device is in a standby state (20) based on a constant charge depletion per time unit.

viii. The method according to embodiment vii, wherein the step of determining charge (41) depletion comprises measuring an increase of charge when the battery set is charged.

ix. The method according to embodiment vi, wherein the exit condition is true when an aggregated charge depletion has reached a threshold charge depletion.

x. The method according to any one of the preceding embodiments, wherein the exit condition is true when the voltage of the battery set has reached a voltage level determined to end the measurements.

xi. The method according to any one of the preceding embodiments, wherein the exit condition is true when a specific amount of time has passed.

xii. The method according to any one of the preceding embodiments, further comprising the step of:
  determining (46) a status of the battery based on the determined battery type.

xiii. The method according to embodiment xii, wherein the first iteration of determining a status of the battery comprises determining whether the battery was new when the method started.

xiv. The method according to embodiment xii, further comprising the step of:
  warning (48) that the battery set needs to be replaced when the battery status indicates that the battery set is near the end of operation.

xv. A battery type determiner (1) for determining a battery type of a battery set (3) arranged to power a host device (10), the battery set comprising at least one exchangeable battery (4), the battery type determiner (1) comprising:
  a voltage sensor (2) arranged to measure a voltage of the battery set, yielding a voltage measurement;
  a memory (62) arranged to store the voltage measurement (61); and
  a controller (60) arranged to repeat measuring the voltage and storing the voltage measurement (61) until an exit condition is true, to thereafter determine the battery type based on the stored voltage measurements.

xvi. A host device (10) comprising the battery type determiner (1) according to embodiment xv, wherein the battery type determiner (1) is arranged to determine the battery type of a battery set (3) powering the host device (10).

xvii. The host device (10) according to embodiment xvi, wherein the host device (10) is a lock device for restricting physical access to a confined space.

xviii. A computer program (66, 91) for determining a battery type of a battery set (3) powering a host device (10), the battery set comprising at least one exchangeable battery (4), the computer program comprising computer program code which, when run on a battery type determiner (1) causes the battery type determiner (1) to:
  measure a voltage of the battery set, yielding a voltage measurement;
  store the voltage measurement;
  repeat the instructions to of measure and store until an exit condition is true; and
  determine the battery type based on the stored voltage measurements.

xix. A computer program product (66, 90) comprising a computer program according to embodiment xviii and a computer readable means on which the computer program is stored.

Using embodiments presented herein, battery type can be determined without the need to sample transient results. This gives a robust and stable way to determine battery type without the need to carefully measure many signal samples in a short time period to obtain a transient response. Hence, the battery type can here be measured during operation of the host device without any significant impact on battery life.

The invention has mainly been described above with reference to a few embodiments. However, as is readily appreciated by a person skilled in the art, other embodiments than the ones disclosed above are equally possible within the scope of the invention, as defined by the appended patent claims.

What is claimed is:
1. A method for determining a battery type of a battery set powering a host device, the battery set comprising at least one exchangeable battery, the method being performed in a battery type determiner and comprising the steps of:
  measuring a voltage of the battery set with a voltage sensor, yielding a voltage measurement;
  determining charge depletion of the battery set;
  storing the voltage measurement and the charge depletion in a memory device;
  repeating the steps of measuring, determining charge depletion and storing until an exit condition is true; and
  determining the battery type based on the stored voltage measurements and the stored charge depletion by:
    calculating a rate of change of the voltage in relation to the charge depletion based on the stored voltage measurements and the stored charge depletion;
    determining the battery type to be an alkaline battery when the rate of change is greater than a threshold rate; and
    determining the battery type to be a lithium battery when the rate of change is less than a threshold rate.

2. The method according to claim 1, wherein the step of determining the battery type further comprises the sub-steps of:
  comparing the stored voltage measurements in relation to charge depletion with curves of voltage in relation to charge depletion for a plurality of battery types;
  selecting the curve which best matches the stored voltage measurements in relation to charge depletion; and
  determining the battery type of the battery set to be the battery type of the selected curve.

3. The method according to claim 2, wherein in the sub-step of comparing, the curves comprise a curve for a battery set comprising mixed battery types.

4. The method according to claim 1, wherein the step of determining the battery type further comprises: when the battery type is determined to be a lithium battery, determining whether the battery set is rechargeable or not based on an initial voltage measurement.

5. The method according to claim 1, wherein the step of determining charge depletion comprises measuring change of charge depletion when the host device is an active state, and estimating change of charge depletion when the host device is in a standby state based on a constant charge depletion per time unit.

6. The method according to claim 5, wherein the step of determining charge depletion comprises measuring an increase of charge when the battery set is charged.

7. The method according to claim 1, wherein the exit condition is true when the charge depletion has reached a threshold charge depletion.

8. The method according to claim 1, wherein the exit condition is true when the voltage of the battery set has reached a voltage level determined to end the measurements.

9. The method according to claim 1, wherein the exit condition is true when a specific amount of time has passed.

10. The method according to claim 1, further comprising the step of:
  determining a status of the battery based on the determined battery type.

11. The method according to claim 10, wherein the first iteration of determining a status of the battery comprises determining whether the battery was new when the method started.

12. The method according to claim 10, further comprising the step of:
  warning that the battery set needs to be replaced when the battery status indicates that the battery set is near the end of operation.

13. A battery type determiner for determining a battery type of a battery set arranged to power a host device, the battery set comprising at least one exchangeable battery, the battery type determiner comprising:
  a voltage sensor arranged to measure a voltage of the battery set, yielding a voltage measurement;
  a charge depletion sensor arranged to determine a charge depletion of the battery set;
  a memory arranged to store the voltage measurement and the charge depletion; and
  a controller arranged to repeat measuring the voltage and storing the voltage measurement until an exit condition is true, to thereafter determine the battery type based on the stored voltage measurements and the stored charge depletion by:
    calculating a rate of change of the voltage measurement in relation to the charge depletion based on the stored voltage measurements and the stored charge depletion, which are both stored in the memory;
    determining the battery type to be an alkaline battery when the rate of change is greater than a threshold rate of change; and
    determining the battery type to be a lithium battery when the rate of change is less than the threshold rate of change.

14. A host device comprising the battery type determiner according to claim 13, wherein the battery type determiner is arranged to determine the battery type of the battery set.

15. The host device according to claim 14, wherein the host device is a lock device for restricting physical access to a confined space.

16. The host device according to claim 14, wherein the exit condition is true when the voltage of the battery set has reached a voltage level determined to end the measurements.

17. A non-transitory computer-readable medium comprising a computer program stored thereon for determining a battery type of a battery set powering a host device, the battery set comprising at least one exchangeable battery-, the computer program comprising computer program code which, when run on a battery type determiner causes the battery type determiner to:
  measure a voltage of the battery set, yielding a voltage measurement;
  determine charge depletion of the battery set;
  store the voltage measurement and the charge depletion;
  repeat the instructions to of measure, determine charge depletion and store until an exit condition is true; and
  determine the battery type based on the stored voltage measurements and the stored charge depletion by:
    calculating a rate of change of the voltage measurement in relation to the charge depletion based on the stored voltage measurements and the stored charge depletion;
    determining the battery type to be an alkaline battery when the rate of change is greater than a first threshold rate of change; and
    determining the battery type to be a lithium battery when the rate of change is less than a second threshold rate of change.

18. The non-transitory computer-readable medium of claim 17, wherein the host device comprises a lock device for restricting physical access to a confined space.

19. The non-transitory computer-readable medium of claim 17, wherein the first threshold rate of change and the second threshold rate of change are the same value.

20. The non-transitory computer-readable medium of claim 17, wherein the exit condition is true when the voltage of the battery set has reached a voltage level determined to end the measurements.

\* \* \* \* \*

UNITED STATES PATENT AND TRADEMARK OFFICE
CERTIFICATE OF CORRECTION

PATENT NO. : 10,126,371 B2
APPLICATION NO. : 15/037800
DATED : November 13, 2018
INVENTOR(S) : Tomas Jonsson Page 1 of 1

It is certified that error appears in the above-identified patent and that said Letters Patent is hereby corrected as shown below:

On the Title Page

Column 1, item (30) Foreign Application Priority Data: REPLACE "13193975" with "13193975.3"

In the Claims

Column 12, Line 40: REPLACE "battery set comprising at least one exchangeable battery-, the" with "battery set comprising at least one exchangeable battery, the..."

Signed and Sealed this
Nineteenth Day of February, 2019

Andrei Iancu
*Director of the United States Patent and Trademark Office*